(12) United States Patent
Yang et al.

(10) Patent No.: US 11,727,872 B2
(45) Date of Patent: Aug. 15, 2023

(54) PIXEL CIRCUIT, DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Lulu Yang, Beijing (CN); Tinghua Shang, Beijing (CN); Huijuan Yang, Beijing (CN); Xiaofeng Jiang, Beijing (CN); Yupeng He, Beijing (CN); Huijun Li, Beijing (CN); Yi Qu, Beijing (CN); Meng Zhang, Beijing (CN); Xin Zhang, Beijing (CN); Hao Zhang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 111 days.

(21) Appl. No.: 17/427,470

(22) PCT Filed: Oct. 26, 2020

(86) PCT No.: PCT/CN2020/123575
§ 371 (c)(1),
(2) Date: Jul. 30, 2021

(87) PCT Pub. No.: WO2022/052229
PCT Pub. Date: Mar. 17, 2022

(65) Prior Publication Data
US 2022/0319423 A1    Oct. 6, 2022

(30) Foreign Application Priority Data
Sep. 10, 2020 (WO) ................ PCT/CN2020/114616

(51) Int. Cl.
*G09G 3/3233* (2016.01)
*H10K 59/131* (2023.01)
(Continued)

(52) U.S. Cl.
CPC ....... *G09G 3/3233* (2013.01); *H10K 59/1213* (2023.02); *H10K 59/131* (2023.02);
(Continued)

(58) Field of Classification Search
CPC ... G09G 2300/0426; G09G 2300/0809; G09G 3/3233; H10K 59/131; H10K 59/126; H10K 59/1213
See application file for complete search history.

(56) References Cited

U.S. PATENT DOCUMENTS

| 10,332,919 B2 | 6/2019 | Li et al. |
| 2015/0187959 A1* | 7/2015 | Yoon ................ H10K 59/126 257/43 |

(Continued)

FOREIGN PATENT DOCUMENTS

| CN | 107293566 A | 10/2017 |
| CN | 107871757 A | 4/2018 |

(Continued)

OTHER PUBLICATIONS

"Crosstalk Analysis between Two Parallel Micro-strip Lines on PCB"; Professional Research; 2007.
(Continued)

*Primary Examiner* — Kevin M Nguyen
(74) *Attorney, Agent, or Firm* — Nath, Goldberg & Meyer; Joshua B. Goldberg

(57) ABSTRACT

A pixel circuit, a display substrate and a display device are disclosed. The pixel circuit includes: a threshold compensation transistor, a shielding element including a first shielding portion and a second shielding portion coupled with each
(Continued)

other; a data writing transistor, orthographic projections of an active layer of the data writing transistor and the gate of the data writing transistor on the substrate are overlapped to form a first overlapping area; the first electrode and the active layer of the data writing transistor are in a same layer, orthographic projections of the first electrode of the data writing transistor and the second shielding portion on the substrate are overlapped to form a second overlapping area; a size of the second overlapping area in the first direction is smaller than that of the first overlapping area in the first direction.

26 Claims, 7 Drawing Sheets

(51) Int. Cl.
H10K 59/121 (2023.01)
H10K 59/126 (2023.01)

(52) U.S. Cl.
CPC ............ G09G 2300/0426 (2013.01); G09G 2300/0809 (2013.01); G09G 2320/0209 (2013.01); H10K 59/126 (2023.02)

(56) References Cited

U.S. PATENT DOCUMENTS

| | | | |
|---|---|---|---|
| 2016/0078799 A1 | 3/2016 | Taneda et al. | |
| 2016/0163780 A1* | 6/2016 | Park | H10K 59/123 257/40 |
| 2016/0322445 A1 | 11/2016 | Lee et al. | |
| 2017/0141177 A1 | 5/2017 | Kim et al. | |
| 2017/0330928 A1* | 11/2017 | Choi | H10K 59/131 |
| 2019/0304373 A1 | 10/2019 | Wang et al. | |
| 2019/0331968 A1* | 10/2019 | Matsushima | G09G 3/3614 |
| 2020/0184903 A1* | 6/2020 | Cho | G09G 3/3291 |
| 2020/0266216 A1* | 8/2020 | Lee | H01L 27/124 |
| 2021/0083035 A1* | 3/2021 | Yun | H10K 59/131 |

FOREIGN PATENT DOCUMENTS

| | | |
|---|---|---|
| CN | 108110013 A | 6/2018 |
| CN | 108206203 A | 6/2018 |
| CN | 108376694 A | 8/2018 |
| CN | 108878494 A | 11/2018 |
| CN | 110114885 A | 8/2019 |
| CN | 110648629 A | 1/2020 |
| CN | 110707237 A | 1/2020 |
| CN | 209912874 U | 1/2020 |
| CN | 111179855 A | 5/2020 |
| CN | 210984240 U | 7/2020 |
| CN | 111508977 A | 8/2020 |
| CN | 111584599 A | 8/2020 |
| EP | 3343630 A1 | 7/2018 |
| JP | 2007-148219 A | 6/2007 |
| KR | 20180131149 A | 12/2018 |

OTHER PUBLICATIONS

Jiang, Dong-chu, et al.; "Crosstalk of Microstrip in High Speed PCB"; Natural Science Journal of Hainan University; vol. 27, No. 2; Jun. 2009.

Sunhenu "PCB trace signal analysis 3-crosstalk"; Apr. 20, 2012.

Office Action dated Apr. 29, 2023 issued in corresponding Chinese Application No. 202080002445.7.

* cited by examiner

G1:

Poly+G1:

PIXEL CIRCUIT, DISPLAY SUBSTRATE AND DISPLAY DEVICE

This is a National Phase Application filed under 35 U.S.C. 371 as a national stage of PCT/CN2020/123575, filed Oct. 26, 2020, an application claiming the benefit of International Application No. PCT/CN2020/114616, filed Sep. 10, 2020, the content of each of which is hereby incorporated by reference in its entirety.

TECHNICAL FIELD

The present disclosure relates to the field of display technology, and in particular to a pixel circuit, a display substrate and a display device.

BACKGROUND

An Organic Light Emitting Diode (OLED) display has characteristics of self-luminescence, wide viewing angle, short response time, high luminous efficiency, wide color gamut, low working voltage, thin panel and the like, thereby becoming a very popular new flat panel display product at home and abroad. In the OLED display, pixel circuits provide driving currents to light emitting devices to drive the light emitting devices to emit light.

SUMMARY

The present disclosure provides a pixel circuit, a display substrate and a display device.

In a first aspect, an embodiment of the present disclosure provides a pixel circuit, including:

a threshold compensation transistor, an active layer of the threshold compensation transistor includes a first channel portion, a second channel portion, and a connection portion between the first channel portion and the second channel portion;

a shielding element coupled to a first power line, the shielding element includes a first shielding portion and a second shielding portion coupled with each other, and an orthographic projection of the first shielding portion on a substrate is overlapped with an orthographic projection of the connection portion on the substrate;

a data writing transistor, a gate of the data writing transistor being coupled to a gate line, a first electrode of the data writing transistor being coupled to a data line, the gate line extending in a first direction, the data line extending in a second direction intersecting the first direction, an orthographic projection of an active layer of the data writing transistor on the substrate being overlapped with an orthographic projection of the gate line on the substrate to form a first overlapping area; the first electrode and the active layer of the data writing transistor are located in a same layer, and an orthographic projection of the first electrode of the data writing transistor on the substrate is overlapped with an orthographic projection of the second shielding portion on the substrate to form a second overlapping area; a size of the second overlapping area in the first direction is smaller than a size of the first overlapping area in the first direction.

In some implementations, a size of the second shielding portion in the second direction is smaller than the size of the first overlapping area in the first direction.

In some implementations, the first power line extends in the second direction, and a distance between an orthogonal projection of the first power line on the substrate and the second overlapping area is greater than a distance between the orthogonal projection of the first power line on the substrate and the first overlapping area.

In some implementations, a difference between a size of the second overlapping area in the first direction and a size of the first overlapping area in the first direction is between 0.3 μm and 0.7 μm.

In some implementations, the size of the second overlapping area in the first direction is between 2.5 μm and 3 μm.

In some implementations, the first electrode of the data writing transistor includes a first conductive portion, a second conductive portion and a third conductive portion, where the first conductive portion is coupled with the data line, one end of the second conductive portion is coupled with the first conductive portion, another end of the second conductive portion is coupled with one end of the third conductive portion, another end of the third conductive portion is coupled with the active layer of the data writing transistor, an orthographic projection of the third conductive portion on the substrate is overlapped with an orthographic projection of the second shielding portion on the substrate, the third conductive portion extends in the second direction, the second conductive portion extends in a third direction, and the third direction intersects the first direction and the second direction.

In some implementations, a width of the third conductive portion is substantially the same as a width of the second conductive portion.

In some implementations, the first power line is located on a side of a layer where the shielding element is located away from the substrate, an interlayer dielectric layer is disposed between the layer where the shielding element is located and a layer where the first power line is located, the shielding element further includes a third shielding portion extending in the second direction, the second shielding portion extends in the first direction, one end of the second shielding portion is coupled with the first shielding portion, another end of the second shielding portion is coupled with the third shielding portion, and the first power line is coupled with the third shielding portion through a first via hole penetrating through the interlayer dielectric layer.

In some implementations, a width of the third shielding portion is 2.5 to 4 times a width of the second shielding portion.

In some implementations, the pixel circuit further includes a first reset transistor and a driving transistor, a gate of the driving transistor is coupled to a first electrode of the first reset transistor and a first electrode of the threshold compensation transistor, a first electrode of the driving transistor is coupled to a second electrode of the data writing transistor, a second electrode of the driving transistor is coupled to a second electrode of the threshold compensation transistor, a gate of the first reset transistor is coupled to a reset line, and a second electrode of the first reset transistor is coupled to an initialization signal line, the first electrode and an active layer of the first reset transistor are arranged in a same layer, and an orthographic projection of the third shielding portion on the substrate is overlapped with an orthographic projection of the first electrode of the first reset transistor on the substrate.

In some implementations, the first electrode of the first reset transistor includes a fourth conductive portion, a fifth conductive portion and a sixth conductive portion, which are coupled in series, the fourth conductive portion extends in the second direction, the fifth conductive portion extends in a fourth direction that intersects both the first direction and the second direction, an orthographic projection of the fourth conductive portion on the substrate and an orthographic projection of the fifth conductive portion on the substrate are overlapped with an orthographic projection of the third shielding portion on the substrate, an orthographic projection of the sixth conductive portion on the substrate is not overlapped with the orthographic projection of the third shielding portion on the substrate, both ends of the third shielding portion in the first direction exceed the fourth conductive portion.

In some implementations, a distance between the second overlapping area and the fourth conductive portion in the first direction is 1.05 to 1.2 times a distance between the first overlapping area and the fourth conductive portion in the first direction.

In some implementations, the gate of the first reset transistor and the gate line are integrated into a single piece, the gate line is located on a side of the active layer of the first reset transistor away from the substrate, the shielding element is located on a side of the gate line away from the substrate, a first gate insulating layer is located between the active layer of the first reset transistor and the gate line, and a second gate insulating layer is located between a layer where the gate line is located and a layer where the shielding element is located, the pixel circuit further includes a first bridge, the first bridge and the first power line are located in a same layer, one end of the first bridge is coupled with the first electrode of the first reset transistor through a second via hole, another end of the first bridge is coupled with the gate of the driving transistor through a third via hole, the second via hole penetrates through the first gate insulating layer, the second gate insulating layer and the interlayer dielectric layer, and the third via hole penetrates through the interlayer dielectric layer and the second gate insulating layer.

In some implementations, the first bridge extends in the second direction, and a distance between the first bridge and the data line coupled to the pixel circuit is 0.4 to 0.6 times a distance between two adjacent data lines.

In some implementations, the second electrode and the active layer of the first reset transistor are located in a same layer, the initialization signal line is located in the same layer as the shielding element, the pixel circuit further includes a second bridge located in the same layer as the first power line, one end of the second bridge is coupled with the second electrode of the first reset transistor through a fourth via hole, another end of the second bridge is coupled with the initialization signal line through a fifth via hole, the fourth via hole penetrates through the first gate insulating layer, the second gate insulating layer and the interlayer dielectric layer, and the fifth via hole penetrates through the interlayer dielectric layer.

In some implementations, the pixel circuit further includes: a capacitor, a first electrode plate of the capacitor and the gate electrode of the driving transistor are of an integral structure, and a second electrode plate of the capacitor is located on a side, away from the substrate, of the first electrode plate and is located in the same layer as the shielding element; the second electrode plate and a second power line are of an integral structure, the second power line extends in the first direction, and the first power line is coupled with the second electrode plate of the capacitor through a sixth via hole penetrating through the interlayer dielectric layer.

In some implementations, the orthogonal projection of the second shielding portion on the substrate and the orthogonal projection of the data line on the substrate form a third overlapping area, the orthogonal projection of the second power line on the substrate and the orthogonal projection of the data line on the substrate form a fourth overlapping area, and an area of the third overlapping area is smaller than an area of the fourth overlapping area.

In some implementations, the active layer and the first electrode of the data writing transistor are both located in the same layer as the active layer of the first reset transistor, the data line is located in the same layer as the first power line, the data line is coupled to the first electrode of the data writing transistor through a seventh via hole, and the seventh via hole penetrates through the first gate insulating layer, the second gate insulating layer, and the interlayer dielectric layer.

In some implementations, the pixel circuit further includes a first light emission controlling transistor, a second light emission controlling transistor, and a second reset transistor, a gate of the first light emission controlling transistor is coupled to a light emission control line, a first electrode of the first light emission controlling transistor is coupled to the first power line, and a second electrode of the first light emission controlling transistor is coupled to the first electrode of the driving transistor;

a gate of the second light emission controlling transistor is coupled to the light emission control line, a first electrode of the second light emission controlling transistor is coupled to the second electrode of the driving transistor, and the second electrode of the second light emission controlling transistor is coupled to a light emitting device;

a gate of the second reset transistor is coupled with the reset line, a first electrode of the second reset transistor is coupled with the second electrode of the second light emission controlling transistor, and a second electrode of the second reset transistor is coupled with the second electrode of the first reset transistor.

In some implementations, the first electrode of the first light emission controlling transistor and the active layer of the first reset transistor are located in a same layer, the first power line is coupled to the first electrode of the first light emission controlling transistor through an eighth via hole, and the eighth via hole penetrates through the first gate insulating layer, the second gate insulating layer, and the interlayer dielectric layer.

In some implementations, the pixel circuit further includes: a third bridge located in the same layer as the first power line and coupled with the second electrode of the second light emission controlling transistor via a ninth via hole penetrating through the first gate insulating layer, the second gate insulating layer and the interlayer dielectric layer, the light emitting device is located on a side, away from the substrate, of a layer where the data line is located, a planarization layer is arranged between the layer where the data line is located and the light emitting device, and the light emitting device is coupled with the third bridge through a tenth through hole penetrating through the planarization layer.

In some implementations, the reset line and the light emission control line both extend in the first direction and are located in the same layer as the gate line, and the orthogonal projection of the driving transistor on the substrate is located between an orthogonal projection of the emission control line on the substrate and the orthogonal projection of the gate line on the substrate.

In some implementations, there is a first distance between the first power line and the second overlapping area in the first direction, and there is a second distance between the data line to which the pixel circuit is coupled and the second overlapping area in the first direction, where the first distance is greater than or equal to the second distance.

In some implementations, the first overlapping area has a first boundary proximal to the data line, the second overlapping area has a second boundary proximal to the data line, and the first boundary and the second boundary are located on a same straight line extending in the second direction.

In a second aspect, an embodiment of the present disclosure further provides a display substrate, including a plurality of pixels, each pixel having the pixel circuit described above disposed therein.

In a third aspect, an embodiment of the present disclosure further provides a display device, which includes the display substrate described above.

DRAWINGS

The accompanying drawings, which are included to provide a further understanding of the disclosure and are incorporated in and constitute a part of this specification, illustrate embodiments of the disclosure and together with the description serve to explain the disclosure, but do not constitute a limitation of the disclosure. In the drawings.

DETAILED DESCRIPTION

To make the objects, technical solutions and advantages of the embodiments of the present disclosure more apparent, the technical solutions of the embodiments of the present disclosure will be clearly and completely described below with reference to the accompanying drawings of the embodiments of the present disclosure. It is to be understood that the described embodiments are only a few embodiments of the present disclosure, and not all embodiments. All other embodiments, which can be derived by a person skilled in the art from the described embodiments of the disclosure without creative effort, are within the scope of protection of the present disclosure.

Unless defined otherwise, technical or scientific terms used herein shall have the ordinary meaning as understood by one of ordinary skill in the art to which this disclosure belongs. The use of "first," "second," and similar terms in the present disclosure is not intended to indicate any order, quantity, or importance, but rather is used to distinguish one element from another. Similarly, the word "comprising" or "including", and the like, means that the element or item preceding the word contains the element or item listed after the word and its equivalent, but does not exclude other elements or items. The terms "coupled" or "connected" and the like are not restricted to physical or mechanical connections, but may include electrical connections, whether direct or indirect.

In an OLED display, a pixel circuit in each pixel supplies a driving current to a light emitting device to drive the light emitting device to emit light. A same column of pixel circuits are coupled to a same data line, and parasitic capacitances exist between the data line and some conductive structures in the pixel circuit, which may cause a certain load on the data line, thereby causing vertical crosstalk (V-crosstalk) to be easily generated when the OLED display displays.

Figure 1:
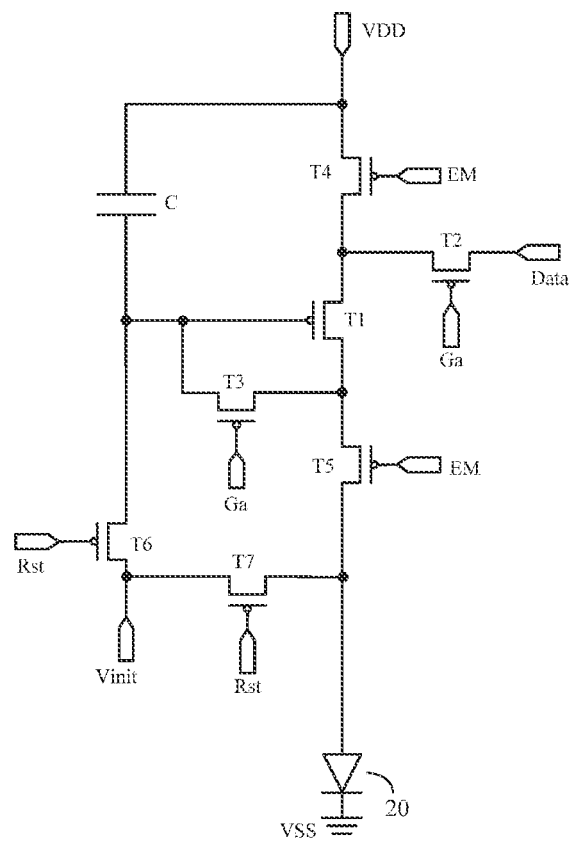
FIG. 1 is a schematic circuit diagram of a pixel circuit provided in an embodiment of the present disclosure.

FIG. 1 is a schematic circuit diagram of a pixel circuit provided in an embodiment of the present disclosure, and as shown in FIG. 1, the pixel circuit includes: a driving transistor T1, a data writing transistor T2, a threshold compensation transistor T3, a first light emission controlling transistor T4, a second light emission controlling transistor T5, a first reset transistor T6, a second reset transistor T7, and a capacitor C. A gate of the driving transistor T1 is coupled to a first electrode of the capacitor C, a first electrode of the threshold compensation transistor T3 and a first electrode of the first reset transistor T6, a first electrode of the driving transistor T1 is coupled to a second electrode of the first light emission controlling transistor T4, and a second electrode of the driving transistor T1 is coupled to a first electrode of the second light emission controlling transistor T5. A gate of the first light emission controlling transistor T4 and a gate of the second light emission controlling transistor T5 are both coupled to a light emission control line EM, a first electrode of the first light emission controlling transistor T4 is coupled to a power line VDD, and a second electrode of the second light emission controlling transistor T5 is coupled to a first electrode of a light emitting device 20. A gate of the data writing transistor T2 is coupled to a gate line Ga, a first electrode of the data writing transistor T2 is coupled to a data line Data, and a second electrode of the data writing transistor T2 is coupled to the first electrode of the driving transistor T1. A gate of the threshold compensation transistor T3 is coupled to the gate line Ga, and a second electrode of the threshold compensation transistor T3 is coupled to the second electrode of the driving transistor T1. A second electrode of the capacitor C is coupled to the power line VDD. The first electrode and the second electrode of the capacitor C are two electrode plates of the capacitor C respectively. A gate of the first reset transistor T6 is coupled to a reset line Rst, a second electrode of the first reset transistor T6 is coupled to an initialization signal line Vinit, a gate of the second reset transistor T7 is coupled to the reset line Rst, a first electrode of the second reset transistor T7 is coupled to the second electrode of the second light emission controlling transistor T5, and a second electrode of the second reset transistor T7 is coupled to the initialization signal line Vinit.

According to characteristics of transistors, the transistors can be divided into N-type transistors and p-type transistors. For the sake of clarity, the embodiment of the present disclosure takes p-type transistors (for example, p-type MOS transistors) as an example to elaborate the technical solutions of the present disclosure, that is, in the description of the present disclosure, the driving transistor T1, the data writing transistor T2, the threshold compensation transistor T3, the first light emission controlling transistor T4, the second light emission controlling transistor T5, the first reset transistor T6, the second reset transistor T7, and the like all may be P-type transistors. However, the transistors in the embodiments of the present disclosure are not limited to P-type transistors, and one skilled in the art may also implement the functions of one or more transistors in the embodiments of the present disclosure by using N-type transistors (e.g., N-type MOS transistors) according to actual needs.

It should be noted that the transistors used in the embodiments of the present disclosure may be thin film transistors or field effect transistors or other switching devices with the same characteristics, and the thin film transistors may include oxide semiconductor thin film transistors, amorphous silicon thin film transistors or polysilicon thin film transistors, or the like. A source and a drain of the transistor may be symmetrical in structure, and thus there may be no difference between the source and the drain of the transistor in physical structure. In the embodiments of the present disclosure, in order to distinguish for the transistor, in addition to the gate being described as a control electrode, one of the source and the drain of the transistor is directly described as the first electrode, and the other one of the source and the drain of the transistor is directly described as the second electrode, and the first electrode and the second electrode of each of all or part of the transistors in the embodiments of the present disclosure may be interchanged as necessary.

The light emitting device 20 in the embodiment of the present disclosure may be a current-driven light emitting device including a light emitting diode (LED) or an organic light emitting diode (OLED), and the embodiment of the present disclosure is described by taking the OLED as an example. Alternatively, the first electrode of the light emitting device 20 is an anode, and the second electrode of the light emitting device 20 is a cathode. The second electrode of the light emitting device 20 is coupled to a power line VSS. The power line VSS may provide a low level signal and the power line VDD may provide a high level signal.

Alternatively, the power line VDD includes a first power line VDD1 and a second power line VDD2, and the first power line VDD1 and the second power line VDD2 may be coupled to form a mesh structure.

The pixel circuit is arranged on a substrate, and in the pixel circuit, active layers of all transistors are arranged in a same layer and are all located in an active semiconductor layer; the gates of the transistors are arranged in a same layer and are all located in a first gate metal layer, and the first gate metal layer is located on a side, away from the substrate, of the active semiconductor layer. The second electrode plate of the capacitor C is located in a second gate metal layer, and the second gate metal layer is located on a side of the first gate metal layer away from the substrate. The first power line VDD is located in a source-drain metal layer, and the source-drain metal layer is located on a side, away from the substrate, of the second gate metal layer. The term "being in a same layer" means that two structures are formed from a same material layer through a patterning process, and thus the two structures are in the same layer in the overlapping relationship; but this does not mean that the distances between the two structures and the substrate must be the same.

The active semiconductor layer may be formed by patterning a semiconductor material layer, the active semiconductor layer includes an active layer and a doped region pattern of each transistor in the pixel circuit, and the active layer and the doped region pattern of each transistor in the same pixel circuit are integrally formed into one piece. For a same transistor, two sides of the active layer of the transistor are each provided with a doped region pattern, and the doped region patterns on the two sides of the active layer can be respectively used as the first electrode and the second electrode of the transistor.

It should be noted that the active semiconductor layer may include an integrally formed low-temperature polysilicon layer, the doped region pattern may be conducted by doping or the like to electrically couple the respective structures, and the active layers of different transistors are separated by doped structures.

For example, the active semiconductor layer may be made of amorphous silicon, polycrystalline silicon, an oxide semiconductor material, or the like. The above-described doped region patterns (i.e., the first and second electrodes) may be patterns formed by doping a semiconductor material with n-type impurities or p-type impurities.

Figure 2:
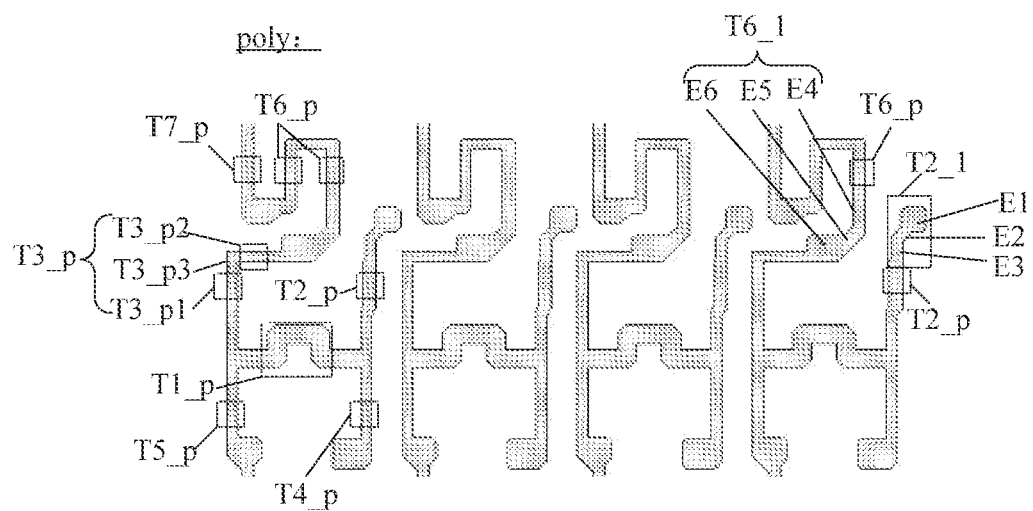
FIG. 2 is a plan view of an active semiconductor layer of a pixel circuit provided in an embodiment of the present disclosure.
Figure 3:
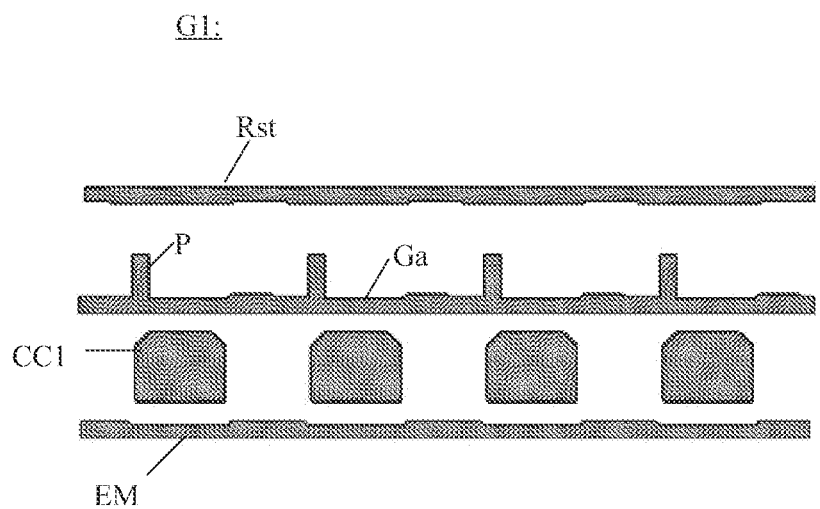
FIG. 3 is a plan view of a first gate metal layer of a pixel circuit provided in an embodiment of the present disclosure.
Figure 4:
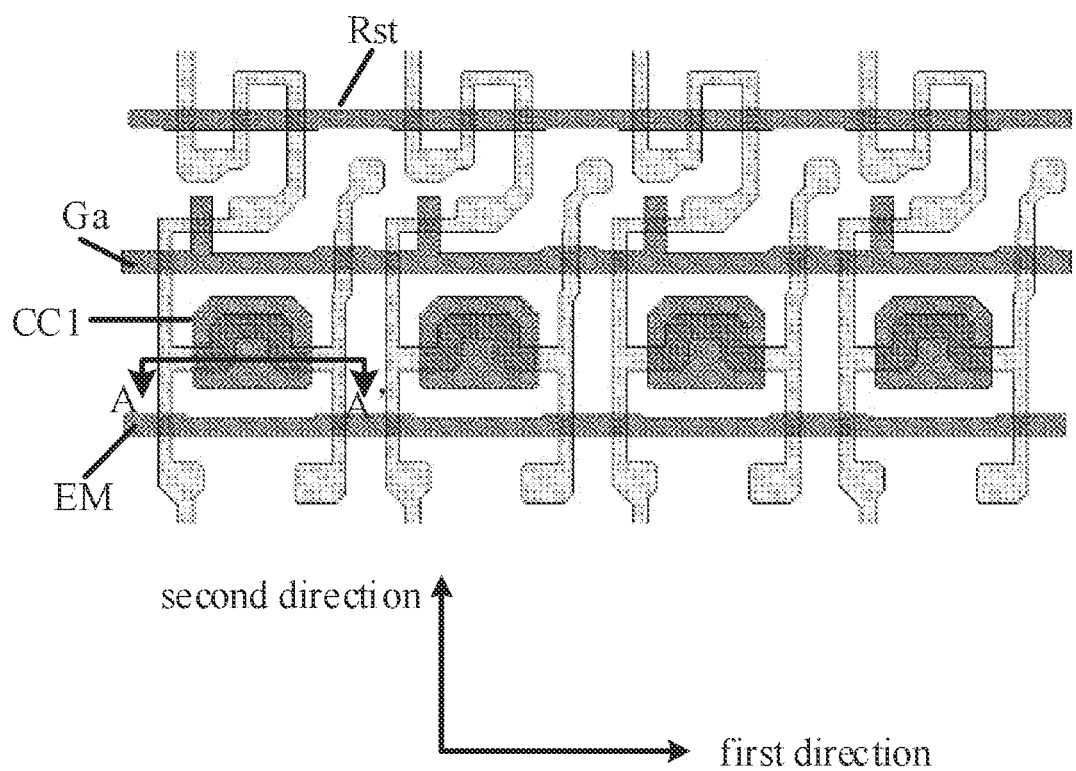
FIG. 4 is a plan view illustrating a superposition of an active semiconductor layer and a first gate metal layer of a pixel circuit provided in an embodiment of the present disclosure.
Figure 5:
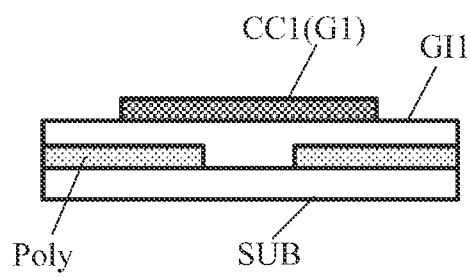
FIG. 5 is a cross-sectional view taken along line A-A' of FIG. 4.
Figure 6:
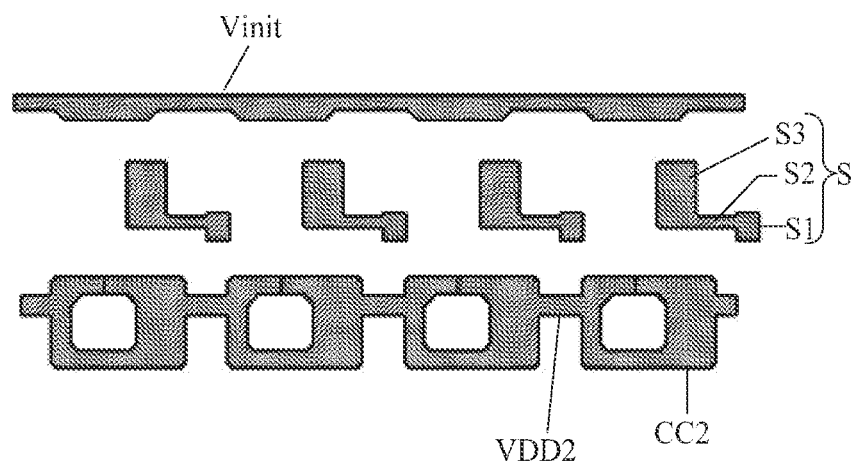
FIG. 6 is a plan view of a second gate metal layer of a pixel circuit provided in an embodiment of the present disclosure.
Figure 7:
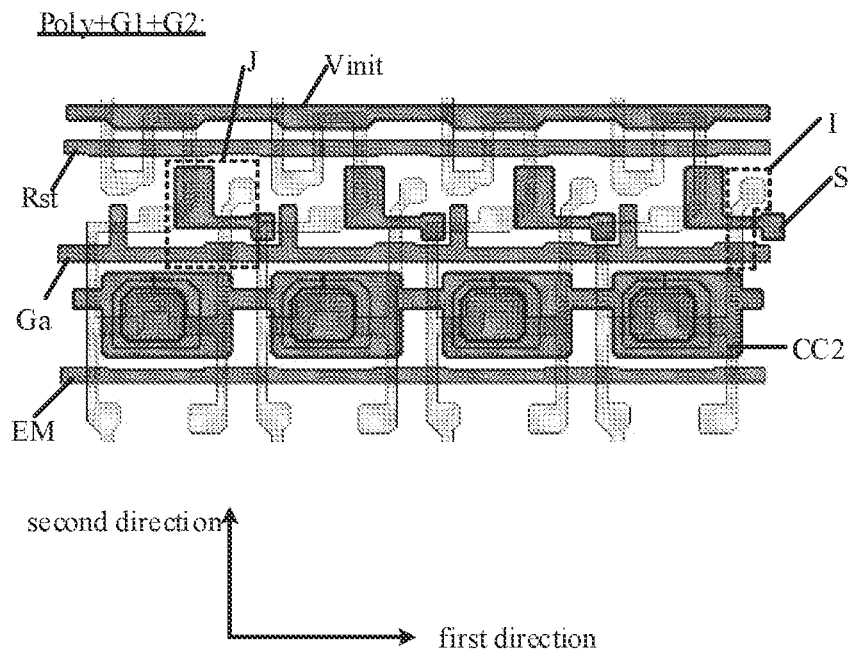
FIG. 7 is a schematic view illustrating a superposition of an active semiconductor layer, a first gate metal layer, and a second gate metal layer of a pixel circuit provided in an embodiment of the present disclosure.
Figure 8:
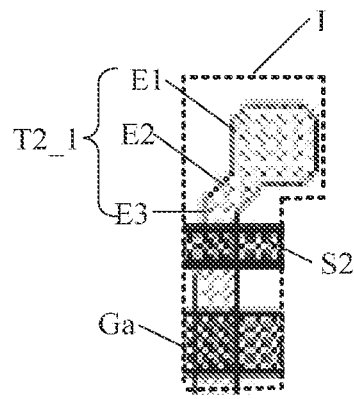
FIG. 8 is an enlarged view of a region I in FIG. 7.
Figure 9:
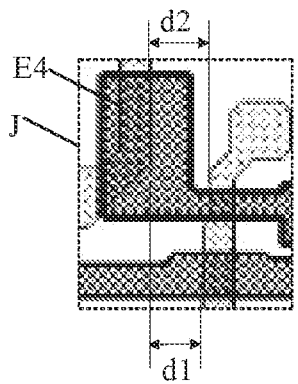
FIG. 9 is an enlarged view of a region J in FIG. 7.
Figure 10:
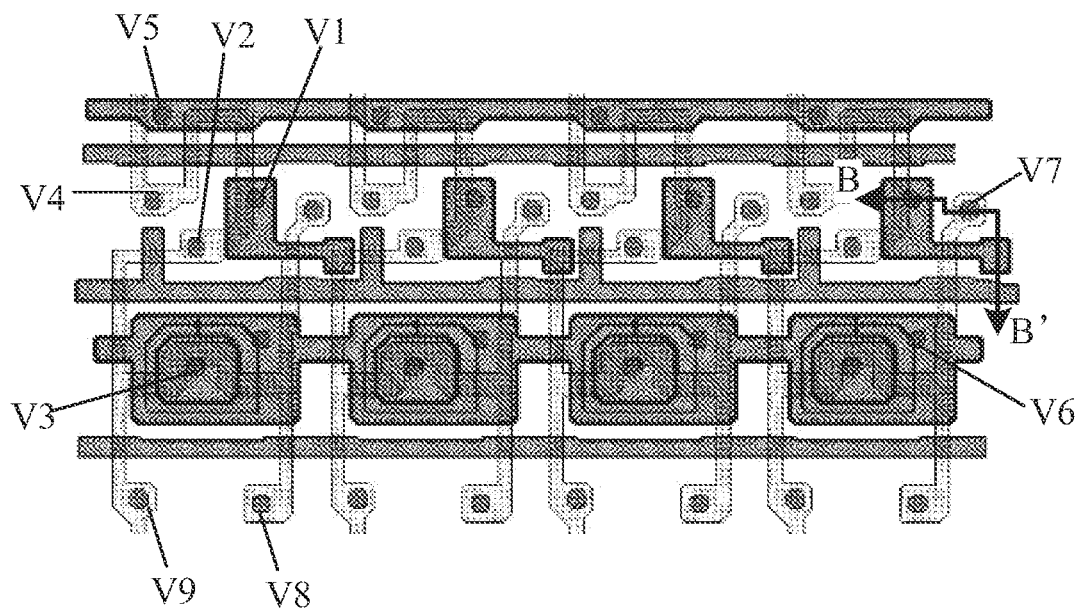
FIG. 10 is a schematic diagram of distribution of via holes in an interlayer dielectric layer provided in an embodiment of the present disclosure.
Figure 11:
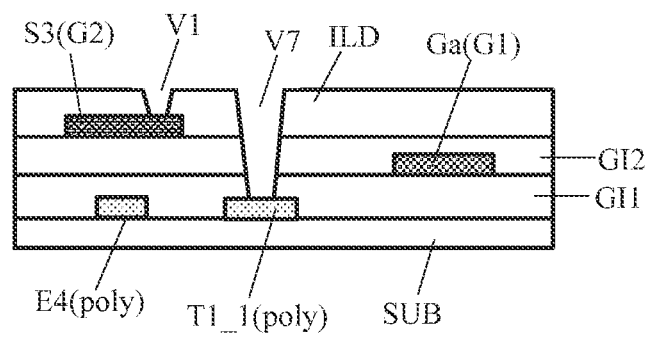
FIG. 11 is a cross-sectional view taken along line B-B' of FIG. 10.
Figure 12:
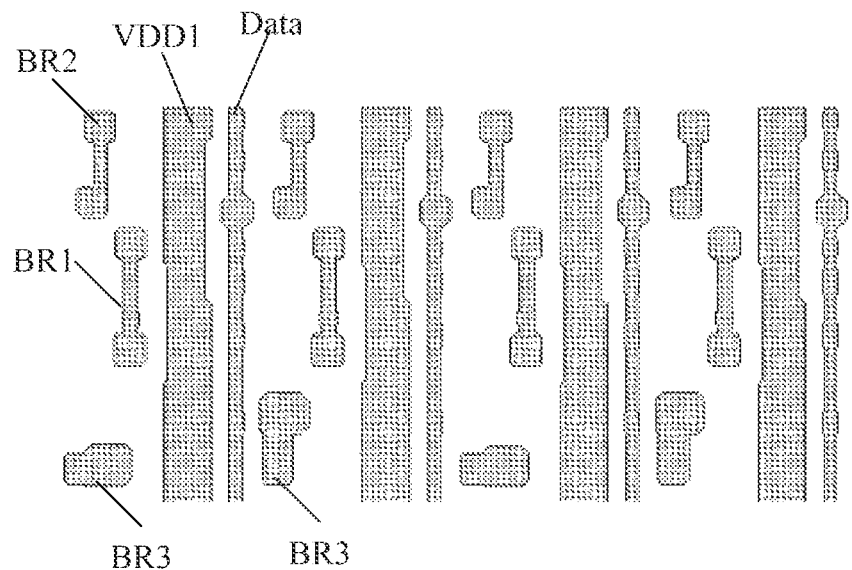
FIG. 12 is a plan view of a source-drain metal layer provided in an embodiment of the present disclosure.
Figure 13:
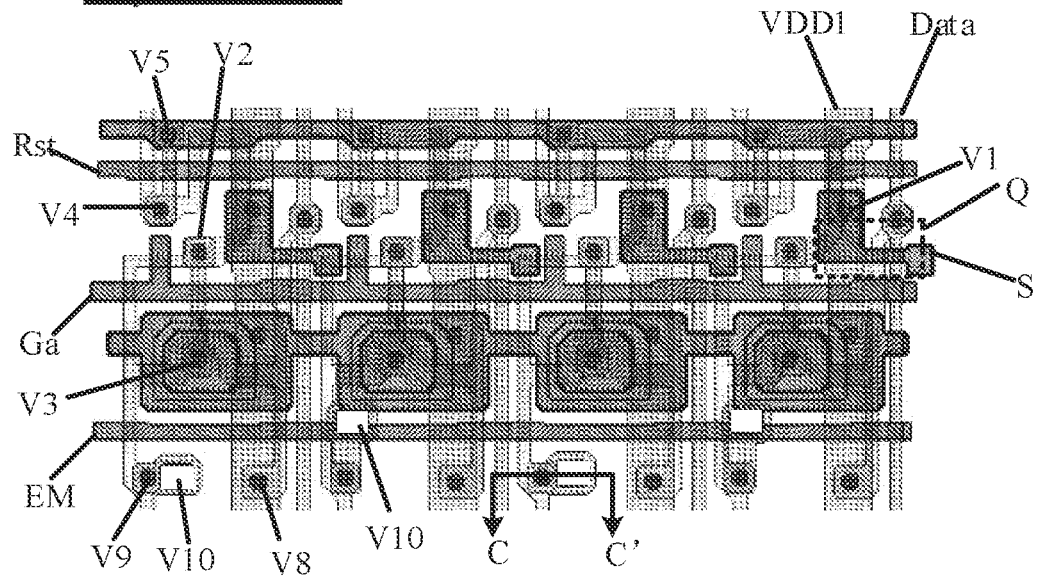
FIG. 13 is a schematic view illustrating a superposition of an active semiconductor layer, a first gate metal layer, a second gate metal layer, and a source-drain metal layer provided in the embodiment of the present disclosure.
Figure 13:
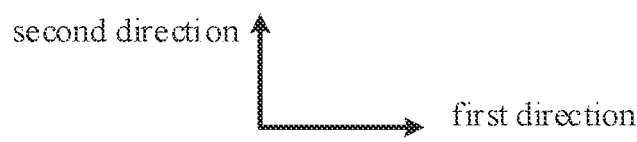
Figure 14:
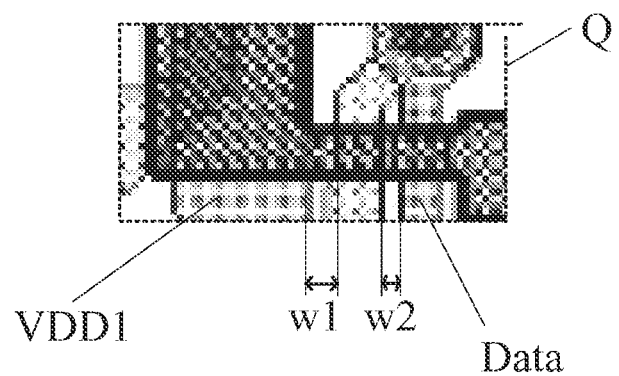
FIG. 14 is an enlarged view of a region Q of FIG. 13.
Figure 15:
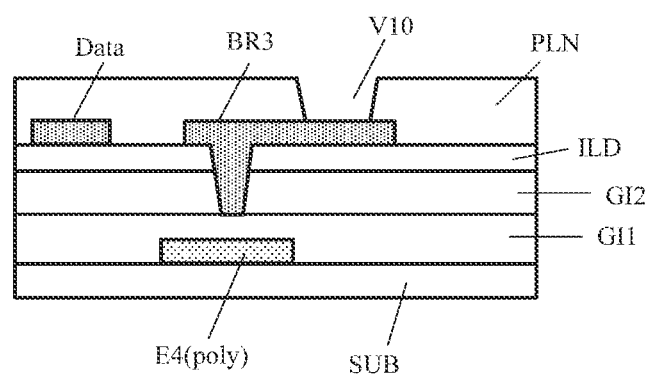
FIG. 15 is a sectional view taken along line C-C' of FIG. 13.

FIG. 2 is a plan view of an active semiconductor layer of a pixel circuit provided in an embodiment of the present disclosure, FIG. 3 is a plan view of a first gate metal layer of the a pixel circuit provided in an embodiment of the present disclosure, FIG. 4 is a plan view illustrating a superimposition of the an active semiconductor layer and the a first gate metal layer of the a pixel circuit provided in an embodiment of the present disclosure, FIG. 5 is a cross-sectional view taken line A-A' in FIG. 4, FIG. 6 is a plan view of a second gate metal layer of the a pixel circuit provided in an embodiment of the present disclosure, FIG. 7 is a schematic view illustrating a superimposition of thean active semiconductor layer, the a first gate metal layer, and the a second gate metal layer of the a pixel circuit provided in an embodiment of the present disclosure, FIG. 8 is an enlarged schematic view of a region I in FIG. 7, FIG. 9 is an enlarged schematic view of a region J in FIG. 7, FIG. 10 is a schematic view of a distribution of via holes in an interlayer dielectric layer provided in an embodiment of the present disclosure, FIG. 11 is a cross-sectional view taken line B-B' in FIG. 10, FIG. 12 is a plan view of a source-drain metal layer provided in the an embodiment of the present disclosure, FIG. 13 is a schematic diagram illustrating a superimposition of an active semiconductor layer, a first gate metal layer, a second gate metal layer, and a source-drain metal layer provided in an embodiment of the present disclosure, FIG. 14 is an enlarged view of a Q region in FIG. 13, and FIG. 15 is a cross-sectional view taken a line C-C' in FIG. 13. FIG. 2 shows the active layers T1_$p$ to T7_$p$ of the transistors T1 to T7, where the threshold compensation transistor T3 is a dual-gate transistor, i.e., has two gates. The active layer T3_$p$ of the threshold compensation transistor T3 includes: a first channel portion T3_p1, a second channel portion T3_p2, and a connection portion T3_p3 between the first channel portion T3_p1 and the second channel portion T3_p2. The first channel portion T3_p and the second channel portion T3_p2 are portions of the active semiconductor layer poly opposite to the two gates of the threshold compensation transistor T3.

The active semiconductor layer poly between the two channel portions of the dual-gate threshold compensating transistor T3 is in a floating state when the threshold compensating transistor T3 is turned off, and is easy to jump under an influence caused by a peripheral line voltage, which may affect a leakage current of the threshold compensating transistor T3, and further affect a light emitting luminance.

In order to keep a voltage of the connection portion T3_p3 of the threshold compensation transistor T3 stable, as shown in FIGS. 6 and 7, the pixel circuit further includes a shielding element S coupled to the first power line VDD1, the shielding element S includes: a first shielding portion S1 and a second shielding portion S2 connected with each other, and an orthogonal projection of the first shielding portion S1 on the substrate overlaps with an orthogonal projection of the connection portion T3_p3 on the substrate. The shielding element S is provided, so that the shielding element S and the connection portion T3_p3 form a capacitor, and the shielding element S may be coupled to the first power line VDD1 to obtain a constant voltage, and the voltage of the connection part T3_p3 in the floating state can be kept stable. The shielding element S overlaps the connection portion T3_p3, so that it can also prevent the connection portion T3_p3 from being illuminated to change characteristics thereof, for example, prevent the voltage of the active semiconductor layer poly from being changed, and prevent crosstalk from being generated.

As shown in FIGS. 2 to 5 and 13, the gate line Ga is located on a side of the active semiconductor layer poly away from the substrate SUB, the gate line Ga extends in a first direction, the data line Data extends in a second direction, and the first direction crosses the second direction, for example, the first direction and the second direction are perpendicular to each other. An orthographic projection of the active layer T2_p of the data writing transistor T2 on the substrate SUB overlaps with an orthographic projection of the gate line Ga on the substrate SUB to form a first overlapping area (i.e., an overlapping area of the active layer of the data writing transistor T2 and the gate line Ga in FIG. 8), where the gate of the data writing transistor T2 is a part of the gate line Ga, and the first overlapping area is the orthographic projection of the active layer of the data writing transistor T2 on the substrate SUB. The first electrode T2_1 and the second electrode of the data writing transistor T2 are conductive structures formed by doping both sides of the active layer, respectively. An orthographic projection of the first electrode T2_1 of the data writing transistor T2 on the substrate SUB is overlapped with an orthographic projection of the second shielding portion S2 on the substrate SUB to form a second overlapping area (i.e., an overlapping area of the first electrode T2_1 of the data writing transistor T2 and the second shielding portion S2 in FIG. 8), and a size of the second overlapping area in the first direction is smaller than that of the first overlapping area in the first direction.

In the embodiment of the present disclosure, the first electrode T2_1 of the data writing transistor T2 is coupled to the data line Data, and since a width (i.e., the size in the first direction) of the overlapping area of the first electrode T2_1 of the data writing transistor T2 and the shielding element S is smaller than that of the active layer T2_p of the data writing transistor T2, the parasitic capacitance between the first electrode T2_1 of the data writing transistor T2 and the shielding element S can be reduced, thereby reducing the load of the data line Data and further improving the vertical crosstalk phenomenon of the display device.

In some implementations, a difference between the size of the second overlapping area in the first direction and the size of the first overlapping area in the first direction is between 0.3 μm and 0.7 μm, for example, is 0.5 μm.

For example, the size of the second overlapping area in the first direction ranges from 2.5 μm to 3 μm.

In some implementations, referring to FIG. 2, FIG. 7 and FIG. 8 together, the first electrode T2_1 of the data writing transistor T2 includes a first conductive portion E1, a second conductive portion E2, and a third conductive portion E3, which are coupled in sequence. An insulating layer is arranged between the data line Data and the first electrode T2_1 of the data writing transistor T2, the data line Data is coupled with the first conductive portion E1 through a via hole in the insulating layer, one end of the second conductive portion E2 is coupled with the first conductive portion E1, another end of the second conductive portion E2 is coupled with one end of the third conductive portion E3, another end of the third conductive portion E3 is coupled with the active layer T2_p of the data writing transistor T2, an orthographic projection of the third conductive portion E3 on the substrate SUB overlaps with an orthographic projection of the second shielding portion S2 on the substrate SUB, the third conductive portion E3 extends in the second direction, the second conductive portion E2 extends in a third direction, and the third direction intersects both the first direction and the second direction.

Alternatively, a width of the third conductive portion E3 is substantially the same as a width of the second conductive portion E2. The "substantially the same" here means that, for example, a difference in width between the third conductive portion E3 and the second conductive portion E2 is not more than 1 μm. In addition, in the embodiments of the present disclosure, the "width" of a structure refers to the dimension of the structure in the direction perpendicular to the extending direction of the structure.

As shown in FIG. 2, the first electrode T6_1 of the first reset transistor T6 includes a fourth conductive portion E4, a fifth conductive portion E5 and a sixth conductive portion E6 which are coupled in series. The fourth conductive portion E4 extends in the second direction, the fifth conductive portion E5 extends in a fourth direction, and the fourth direction intersects both the first direction and the second direction. For example, the fourth direction may be parallel or nearly parallel to the first direction.

In the active semiconductor layer poly, the second electrode of the data writing transistor T2, the second electrode of the first light emission controlling transistor T4 and the first electrode of the driving transistor T1 are formed into a single piece, the first electrode of the second light emission controlling transistor T5, the second electrode of the driving transistor T1 and the second electrode of the threshold compensating transistor T3 are formed into a single piece, and the first electrode of the threshold compensating transistor T3 and the first electrode of the first reset transistor T6 are formed into a single piece.

As shown in FIGS. 3 to 5, the first gate metal layer G1 includes: the gates of the transistors T1 to T7, the gate line Ga, the emission control line EM, and the reset line Rst. A first gate insulating layer GI1 is disposed between the first gate metal layer G1 and the active semiconductor layer poly. The gate of the data writing transistor T2 is a portion of the gate line Ga, an overlapping portion of the gate line Ga and the data writing transistor T2 is the gate of the data writing transistor T2, and the gate of the threshold compensation transistor T3 and the gate line Ga are formed as an integral structure (i.e., formed into a single piece), where a first gate of the threshold compensation transistor T3 may be a portion of the gate line Ga overlapping the active semiconductor layer poly, and a second gate of the threshold compensation transistor T3 may be a portion of a protrusion structure P protruding from the gate line Ga overlapping the active semiconductor layer poly. The gate of the first light emission controlling transistor T4 may be a first portion of the light emission control line EM overlapping the active semiconductor layer poly, and the gate of the second light emission controlling transistor T5 may be a second portion of the light emission control line EM overlapping the active semiconductor layer poly; the gate of the first reset transistor T6 may be a first portion of the reset line Rst overlapping the active semiconductor layer poly, and the gate of the second reset transistor T7 may be a second portion of the reset line Rst overlapping the active semiconductor layer poly. The gate of the driving transistor T1 and the first electrode plate CC1 of the capacitor C may be formed into a single piece.

For example, the light emission control line EM and the reset line Rst each extend in the first direction, and the gate line Ga is located between the light emission control line EM and the reset line Rst.

For example, in the second direction, the first electrode plate CC1 of the capacitor C (i.e., the gate of the driving transistor T1) is located between the gate line Ga and the light emission control line EM. The protruding structure P protruding from the gate line Ga is located at a side of the gate line Ga away from the light emission control line EM.

For example, as shown in FIGS. 2 to 4, in the second direction, the gate of the data writing transistor T2, the gate of the threshold compensation transistor T3, and the gate of the first reset transistor T6 are all located at a first side of the gate of the driving transistor T1, and the gate of the first light emission controlling transistor T4, the gate of the second light emission controlling transistor T5, and the gate of the second reset transistor T7 are all located at a second side of the gate of the driving transistor T1. For example, in the example shown in FIG. 2 to 4, the first side and the second side of the gate of the driving transistor T1 of the pixel circuit are two sides, opposite to each other, of the gate of the driving transistor T1 in the second direction. For example, as shown in FIGS. 2 and 3, the first side of the gate of the driving transistor T1 may be an upper side of the gate of the driving transistor T1, and the second side of the gate of the driving transistor T1 may be a lower side of the gate of the driving transistor T1. For the lower side, for example, a side of the display substrate for binding the driving chip is the lower side of the display substrate, and the lower side of the gate of the driving transistor T1 is the side of the gate of the driving transistor T1 proximal to the driving chip. The upper side is an opposite to the lower side, for example, the upper side is a side of the gate of the driving transistor T1 away from the driving chip.

For example, in some implementations, as shown in FIGS. 2 to 3, in the first direction, the gate of the data writing transistor T2 and the gate of the first light emission controlling transistor T4 are located at a third side of the gate of the driving transistor T1, and the first gate of the threshold compensating transistor T3, the gate of the second light emission controlling transistor T5 and the gate of the second reset transistor T7 are located at a fourth side of the gate of the driving transistor T1. For example, in the example shown in FIGS. 2 to 4, the third and fourth sides of the gate of the driving transistor T1 of the pixel circuit are two sides, opposite to each other, of the gate of the driving transistor T1 in the first direction. For example, as shown in FIGS. 2 to 4, the third side of the gate of the driving transistor T1 of the pixel circuit may be a right side of the gate of the driving transistor T1, and the fourth side of the gate of the driving transistor T1 of the pixel circuit may be a left side of the gate of the driving transistor T1. The left and right sides are opposite sides, for example, among the data line Data and the first power line VDD1 coupled to the same pixel circuit, the data line Data is on the right side of the first power line VDD1, and the first power line VDD1 is on the left side of the data line Data.

In some implementations, referring to FIG. 6, FIG. 7, FIG. 10, and FIG. 11, the second gate metal layer G2 is located on a side of the first gate metal layer G1 away from the substrate SUB, and a second gate insulating layer GI2 is disposed between the first gate metal layer G1 and the second gate metal layer G2.

As shown in FIG. 6, the second gate metal layer G2 includes the initialization signal line Vinit, the shielding element S, the second electrode plate CC2 of the capacitor C, and the second power line VDD2. The second power line VDD2 and the second electrode plate CC2 of the capacitor C may be formed into a single piece, and the second power line VDD2 and the second plate CC2 of the capacitor C are used to communicate with the first power line VDD1 (described later) extending in the second direction, so that a mesh wiring is formed on the display substrate to reduce resistance. The second electrode plate CC2 of the capacitor C at least partially overlaps the first electrode plate CC1 of the capacitor C to form the capacitor C. The initialization signal line Vinit extends in the first direction, and an orthographic projection of the light emission control line EM on the substrate SUB is located between the orthographic projection of the driving transistor T1 on the substrate SUB and the initialization signal line Vinit.

The shielding element S includes the first shielding portion S1, the second shielding portion S2 and a third shielding portion S3, the third shielding portion S3 extends in the second direction, the second shielding portion S2 extends in the first direction, one end of the second shielding portion S2 is coupled to the first shielding portion S1, another end of the second shielding portion S2 is coupled to the third shielding portion S3, and the first power line VDD1 is coupled to the third shielding portion S3.

For example, an orthographic projection of the third shielding portion S3 on the substrate SUB overlaps an orthographic projection of the first electrode T6_1 of the first reset transistor T6 on the substrate SUB, so that a capacitor is formed between the third shielding portion S3 and the first electrode T6_1 of the first reset transistor T6, and the gate voltage of the driving transistor T1 is prevented from being interfered by other signals.

For example, the orthographic projection of the third shielding portion S3 on the substrate SUB overlaps an orthographic projection of the fourth conductive portion E4 on the substrate SUB, and the orthographic projection of the third shielding portion S3 on the substrate SUB overlaps an orthographic projection of the fifth conductive portion E5 on the substrate SUB. Both ends of the third shielding portion S3 in the first direction exceed the fourth conductive portion E4, that is, both left and right edges of the fourth conductive portion E4 are located between both left and right edges of the third shielding portion S3.

In some implementations, as shown in FIG. 9, a distance d2 between the second overlapping area and the fourth conductive portion E4 in the first direction is 1.05 to 1.2 times a distance d1 between the first overlapping area and the fourth conductive portion E4 in the first direction, so as to further reduce interference on the gate voltage of the driving transistor T1. For example, d1 ranges from 5 μm to 6 μm, and d2 is 1.1 times d1.

In some implementations, a width of the third shielding portion S3 may be 2.5 to 4 times a width of the second shielding portion S2. For example, the width of the third shade portion S3 is 3 times the width of the second shielding portion S2. The width of the second shielding portion S2 is the size of the second shielding portion S2 in the second direction, and the size of the first shielding portion S1 in the second direction may be greater than the width of the second shielding portion S2.

In some examples, the width of the second shielding portion S2 may be set as small as possible, so as to reduce a size of a capacitor formed by the second shielding portion S2 and the first electrode T2_1 of the data writing transistor T2, thereby further reducing the load of the data line Data and further improving the vertical crosstalk of the display device.

For example, the width of the second shielding portion S2 is smaller than the size of the first overlapping area, in the first direction, formed by the active layer T2_p of the data writing transistor T2 and the gate line. The width of the second shielding portion S2 is the size of the second shielding portion S2 in the second direction.

For example, an orthographic projection of the second shielding portion S2 on the substrate SUB overlaps an orthographic projection of the data line Data on the substrate SUB to form a third overlapping area; an orthographic projection of the second power line VDD2 on the substrate SUB is overlapped with the orthographic projection of the data line Data on the substrate SUB to form a fourth overlapping area, and an area of the third overlapping area is smaller than that of the fourth overlapping area. Specifically, the size of the second shielding portion S2 in the second direction is smaller than the size of the second power line VDD2 in the second direction.

In some examples, the width of the second shielding portion S2 and the width of the data line Data may be approximately equal.

In some implementations, referring to FIG. 10 to FIG. 15, the source-drain metal layer SD is located on a side of the second gate metal layer G2 away from the substrate SUB, and an interlayer dielectric layer ILD is disposed between the source-drain metal layer SD and the second gate metal layer G2. The interlayer dielectric layer ILD is provided with a plurality of via holes, and as shown in FIG. 10, the interlayer dielectric layer ILD is provided with a first via hole V1 to a ninth via hole V9.

The first via hole V1 penetrates through the interlayer dielectric layer ILD and exposes a portion of the third shielding portion S3; the second via hole V2 simultaneously penetrates through the interlayer dielectric layer ILD, the second gate insulating layer GI2 and the first gate insulating layer GI1, and exposes a portion of the first electrode of the first reset transistor T6, for example, the second via hole V2 exposes a portion of the sixth conductive portion E6; the third via hole V3 penetrates through the interlayer dielectric ILD and the second gate insulating layer GI2 at the same time, and exposes a portion of the gate of the driving transistor T1. An annular hole is formed in the second electrode plate CC2 of the capacitor C, and the third via hole V3 penetrates through the annular hole in the second electrode plate CC2 and is spaced from the annular hole, so that a conductive material formed in the third via hole V3 subsequently is prevented from being in false contact with the capacitor C. The fourth via hole V4 simultaneously penetrates through the first gate insulating layer GI1, the second gate insulating layer GI2 and the interlayer dielectric layer ILD, and exposes a portion of the second electrode of the first reset transistor T6; the fifth via hole V5 penetrates through the interlayer dielectric layer ILD and exposes a portion of the initialization signal line Vinit; the sixth via hole V6 penetrates through the interlayer dielectric ILD and exposes a portion of the second electrode plate CC2 of the capacitor C; the number of the sixth via holes V6 may be one or more. The seventh via hole V7 simultaneously penetrates through the first gate insulating layer GI1, the second gate insulating layer GI2 and the interlayer dielectric layer ILD, and exposes a portion of the first electrode T2_1 of the data writing transistor T2. For example, the seventh via hole V7 exposes a portion of the first conductive portion E1. The eighth via hole V8 simultaneously penetrates through the first gate insulating layer GI1, the second gate insulating layer GI2 and the interlayer dielectric layer ILD, and exposes a portion of the first electrode of the first light emission controlling transistor T4. The ninth via hole V9 simultaneously penetrates through the first gate insulating layer GI1, the second gate insulating layer GI2 and the interlayer dielectric layer ILD, and exposes a portion of the second electrode of the second light emission controlling transistor T5.

As shown in FIGS. 12 and 13, the source-drain metal layer SD includes: the first power line VDD1, the data line Data, a first bridge BR1, a second bridge BR2, and a third bridge BR3.

For example, the first power line VDD1 is coupled to the third shielding portion S3 through the first via hole V1.

For example, the first bridge BR1 extends in the second direction, and one end of the first bridge BR1 is coupled to the first electrode of the first reset transistor T6 through the second via hole V2, and another end of the first bridge BR1 is coupled to the gate of the drive transistor T1 through the third via hole V3.

The first bridge BR1, the first electrode of the first reset transistor T6, and the first electrode of the threshold compensation transistor T3 are coupled together to form a first conductive structure. In some examples, a distance between the first bridge BR1 and the data line Data to which the pixel circuit, in which the first bridge BR1 is located, is coupled is 0.4 to 0.6 times (e.g., 0.5 times) a distance between two adjacent data lines Data.

In some implementations, as shown in FIG. 14, there is a first distance w1 between the first power line VDD1 and the second overlapping area in the first direction, and there is a second distance w2 between the data line Data and the second overlapping area in the first direction. It should be noted that, the first distance w1 refers to a distance between a boundary of an orthographic projection of the first power line VDD1 on the substrate SUB proximal to the second overlapping area and a boundary of the second overlapping area proximal to the first power line VDD1; the second distance w2 refers to a distance between a boundary of the orthographic projection of the data line Data on the substrate SUB proximal to the second overlapping area and a boundary of the second overlapping area proximal to the data line Data. The first distance w1 is greater than or equal to the second distance w2. For example, the first distance w1 is 1.5 to 3 times the second distance w2. In other implementations, there is a first distance w1 between the orthographic projection of the first power line VDD1 on the substrate SUB and the second overlapping area, and there is no space between the orthographic projection of the data line Data on the substrate SUB and the second overlapping area, that is, the orthographic projection of the data line Data on the substrate SUB contacts or overlaps the second overlapping area.

In some examples, the distance between the orthographic projection of the first power line VDD1 on the substrate SUB and the second overlapping area is greater than the distance between the orthographic projection of the first power line VDD1 on the substrate SUB and the first overlapping area, so that a distance between the first electrode T2_1 of the data writing transistor T2 and the first conductive structure is increased, a parasitic capacitance between the first electrode T2_1 of the data writing transistor T2 and the first conductive structure is decreased, and an influence of a voltage jump of the data line Data on a potential of the gate of the driving transistor T1 is decreased.

It should be understood that the drawings show a plurality of first power lines VDD1, and the distance between the orthographic projection of the first power line VDD1 on the substrate SUB and the second overlapping area, and the distance between the orthographic projection of the first power line VDD1 on the substrate SUB and the first overlapping area are for the first overlapping area, the second overlapping area in the same pixel circuit, and the first power line VDD1 coupled to the pixel circuit.

In some implementations, a size of the second overlapping area in the first direction is smaller than a dimension of the first overlapping area in the first direction, and the distance d2 between the second overlapping area and the fourth conductive portion E4 in the first direction is 1.05 to 1.2 times the distance d1 between the first overlapping area and the fourth conductive portion E4 in the first direction.

For example, the first overlapping area has a first boundary proximal to the data line Data, the second overlapping area has a second boundary proximal to the data line Data, and the first boundary and the second boundary are located on the same straight line extending in the second direction. That is, the right edge of the third conductive portion E1 of the data writing transistor T1 is on the same line as the right edge of the active layer T1_p of the data writing transistor T1.

As shown in connection with FIGS. 2, 12 and 13, one end of the second bridge BR2 is coupled to the second electrode of the first reset transistor T6 through the fourth via hole V4, and another end of the second bridge BR2 is coupled to the initialization signal line Vinit through the fifth via hole V5. The first power line VDD1 is coupled to the second electrode plate CC2 of the capacitor C through the sixth via hole V6, so that the first power line VDD1 is electrically coupled to the second power line VDD2, and a mesh wiring is formed, so that the resistance of the signal line for transmitting the power signal is relatively small, and the uniformity of the distribution of the power voltage in the pixels of the display substrate is improved.

The data line Data is coupled to the first electrode of the data writing transistor T2 through the seventh via hole V7. The first power line VDD1 is coupled to the first electrode of the first light emission controlling transistor T4 through the eighth via hole V8. The third bridge BR3 is coupled to the second electrode of the second light emission controlling transistor T5 through the ninth via hole V9.

In some implementations, as shown in FIG. 15, a planarization layer PLN is provided at a side of the source-drain metal layer SD away from the substrate SUB, and the light emitting device is disposed on a side of the planarization layer PLN away from the substrate SUB. A tenth via hole V10 is provided in the planarization layer, the tenth via hole V10 exposes a portion of the third bridge BR3, and the light emitting device is coupled to the third bridge BR3 through the tenth via hole V10 in the planarization layer PLN, so that the coupling between the light emitting device and the second electrode of the second light emission controlling transistor T5 is realized.

The light emitting device includes a first electrode, a light emitting layer, and a second electrode, which are arranged in a direction away from the substrate SUB. A pixel defining layer is disposed on the planarization layer, a pixel opening is disposed in the pixel defining layer, the pixel opening exposes at least a portion of the first electrode of the light emitting device, the light emitting layer is disposed in the pixel opening, and the first electrode is coupled to the third bridge BR3 through the tenth via hole V10.

An embodiment of the present disclosure further provides a display substrate, which includes a plurality of pixels, and each pixel is provided with the pixel circuit in the above embodiments.

For example, a plurality of pixel circuits are arranged in a plurality of rows and a plurality of columns, the pixel circuits in a same row are coupled to a same gate line, the pixel circuits in a same row are coupled to a same reset line, the pixel circuits in a same row are coupled to a same light emission control line, the pixel circuits in a same row are coupled to a same initialization signal line, and the pixel circuits in a same column are coupled to a same first power line.

An embodiment of the disclosure further provides a display device, which includes the display substrate described above. The display device may be any product or component with a display function, such as an OLED panel, a mobile phone, a tablet computer, a television, a display, a notebook computer, a digital photo frame, a navigator and the like.

It will be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and scope of the disclosure, and these changes and modifications are to be considered within the scope of the disclosure.

The invention claimed is:

1. A pixel circuit, comprising:
 a threshold compensation transistor, an active layer of the threshold compensation transistor comprises a first channel portion, a second channel portion, and a connection portion between the first channel portion and the second channel portion;
 a shielding element coupled to a first power line, the shielding element comprises a first shielding portion and a second shielding portion coupled with each other, and an orthographic projection of the first shielding portion on a substrate is overlapped with an orthographic projection of the connection portion on the substrate;
 a data writing transistor, a gate of the data writing transistor being coupled to a gate line, a first electrode of the data writing transistor being coupled to a data line, the gate line extending in a first direction, the data line extending in a second direction intersecting the first direction, an orthographic projection of an active layer of the data writing transistor on the substrate being overlapped with an orthographic projection of the gate line on the substrate to form a first overlapping area; the first electrode of the data writing transistor and the active layer are located in a same layer, and an orthographic projection of the first electrode of the data writing transistor on the substrate is overlapped with an orthographic projection of the second shielding portion on the substrate to form a second overlapping area; a size of the second overlapping area in the first direction is smaller than a size of the first overlapping area in the first direction.

2. The pixel circuit according to claim 1, wherein a size of the second shielding portion in the second direction is smaller than the size of the first overlapping area in the first direction.

3. The pixel circuit according to claim 1, wherein the first power line extends in the second direction, and a distance between an orthogonal projection of the first power line on the substrate and the second overlapping area is greater than a distance between the orthogonal projection of the first power line on the substrate and the first overlapping area.

4. The pixel circuit according to claim 1, wherein a difference between the size of the second overlapping area in the first direction and the size of the first overlapping area in the first direction is between 0.3 μm and 0.7 μm.

5. The pixel circuit according to claim 1, wherein the size of the second overlapping area in the first direction is between 2.5 μm and 3 μm.

6. The pixel circuit according to claim 1, wherein the first electrode of the data writing transistor comprises a first conductive portion, a second conductive portion and a third conductive portion, wherein the first conductive portion is coupled with the data line, one end of the second conductive portion is coupled with the first conductive portion, another end of the second conductive portion is coupled with one end of the third conductive portion, another end of the third conductive portion is coupled with the active layer of the data writing transistor, an orthographic projection of the third conductive portion on the substrate is overlapped with an orthographic projection of the second shielding portion on the substrate, the third conductive portion extends in the second direction, the second conductive portion extends in a third direction, and the third direction intersects the first direction and the second direction.

7. The pixel circuit according to claim 6, wherein a width of the third conductive portion is substantially the same as a width of the second conductive portion.

8. The pixel circuit according to claim 1, wherein the first power line is located on a side of a layer where the shielding element is located away from the substrate, an interlayer dielectric layer is disposed between the layer where the shielding element is located and a layer where the first power line is located, the shielding element further comprises a third shielding portion extending in the second direction, the second shielding portion extends in the first direction, one end of the second shielding portion is coupled with the first shielding portion, another end of the second shielding portion is coupled with the third shielding portion, and the first power line is coupled with the third shielding portion through a first via hole penetrating through the interlayer dielectric layer.

9. The pixel circuit according to claim 8, wherein a width of the third shielding portion is 2.5 to 4 times a width of the second shielding portion.

10. The pixel circuit according to claim 8, further comprising: a first reset transistor and a driving transistor, a gate of the driving transistor is coupled to a first electrode of the first reset transistor and a first electrode of the threshold compensation transistor, a first electrode of the driving transistor is coupled to a second electrode of the data writing transistor, a second electrode of the driving transistor is coupled to a second electrode of the threshold compensation transistor, a gate of the first reset transistor is coupled to a reset line, and a second electrode of the first reset transistor is coupled to an initialization signal line, the first electrode and an active layer of the first reset transistor are arranged in a same layer, and an orthographic projection of the third shielding portion on the substrate is overlapped with an orthographic projection of the first electrode of the first reset transistor on the substrate.

11. The pixel circuit according to claim 10, wherein the first electrode of the first reset transistor comprises a fourth conductive portion, a fifth conductive portion and a sixth conductive portion, which are coupled in series, the fourth conductive portion extends in the second direction, the fifth conductive portion extends in a fourth direction that intersects both the first direction and the second direction, an orthographic projection of the fourth conductive portion on the substrate and an orthographic projection of the fifth conductive portion on the substrate are overlapped with an orthographic projection of the third shielding portion on the substrate, an orthographic projection of the sixth conductive portion on the substrate is not overlapped with the orthographic projection of the third shielding portion on the substrate, both ends of the third shielding portion in the first direction exceed the fourth conductive portion.

12. The pixel circuit according to claim 11, wherein a distance between the second overlapping area and the fourth conductive portion in the first direction is 1.05 to 1.2 times a distance between the first overlapping area and the fourth conductive portion in the first direction.

13. The pixel circuit according to claim 10, wherein the gate of the first reset transistor and the gate line are integrated into a single piece, the gate line is located on a side of the active layer of the first reset transistor away from the substrate, the shielding element is located on a side of the gate line away from the substrate, a first gate insulating layer is located between the active layer of the first reset transistor and the gate line, and a second gate insulating layer is located between a layer where the gate line is located and a layer where the shielding element is located, the pixel circuit further comprises a first bridge, the first bridge and the first power line are located in a same layer, one end of the first bridge is coupled with the first electrode of the first reset transistor through a second via hole, another end of the first bridge is coupled with the gate of the driving transistor through a third via hole, the second via hole penetrates through the first gate insulating layer, the second gate insulating layer and the interlayer dielectric layer, and the third via hole penetrates through the interlayer dielectric layer and the second gate insulating layer.

14. The pixel circuit according to claim 13, wherein the first bridge extends in the second direction, and a distance between the first bridge and the data line coupled to the pixel circuit is 0.4 to 0.6 times a distance between two adjacent data lines.

15. The pixel circuit according to claim 13, wherein the second electrode and the active layer of the first reset transistor are located in a same layer, the initialization signal line is located in the same layer as the shielding element,
the pixel circuit further comprises a second bridge located in the same layer as the first power line, one end of the second bridge is coupled with the second electrode of the first reset transistor through a fourth via hole, another end of the second bridge is coupled with the initialization signal line through a fifth via hole, the fourth via hole penetrates through the first gate insulating layer, the second gate insulating layer and the interlayer dielectric layer, and the fifth via hole penetrates through the interlayer dielectric layer.

16. The pixel circuit according to claim 10, further comprising: a capacitor, a first electrode plate of the capacitor and the gate electrode of the driving transistor are of an integral structure, and a second electrode plate of the capacitor is located on a side, away from the substrate, of the first electrode plate and is located in the same layer as the shielding element; the second electrode plate and a second power line are of an integral structure, the second power line extends in the first direction, and the first power line is coupled with the second electrode plate of the capacitor through a sixth via hole penetrating through the interlayer dielectric layer.

17. The pixel circuit according to claim 16, wherein the orthogonal projection of the second shielding portion on the substrate and the orthogonal projection of the data line on the substrate form a third overlapping area, the orthogonal projection of the second power line on the substrate and the orthogonal projection of the data line on the substrate form a fourth overlapping area, and an area of the third overlapping area is smaller than an area of the fourth overlapping area.

18. The pixel circuit according to claim 13, wherein the active layer and the first electrode of the data writing transistor are both located in the same layer as the active layer of the first reset transistor, the data line is located in the same layer as the first power line, the data line is coupled to the first electrode of the data writing transistor through a seventh via hole, and the seventh via hole penetrates through the first gate insulating layer, the second gate insulating layer, and the interlayer dielectric layer.

19. The pixel circuit according to claim 13, further comprising a first light emission controlling transistor, a second light emission controlling transistor, and a second reset transistor,
a gate of the first light emission controlling transistor is coupled to a light emission control line, a first electrode of the first light emission controlling transistor is coupled to the first power line, and a second electrode of the first light emission controlling transistor is coupled to the first electrode of the driving transistor;
a gate of the second light emission controlling transistor is coupled to the light emission control line, a first electrode of the second light emission controlling transistor is coupled to the second electrode of the driving transistor, and a second electrode of the second light emission controlling transistor is coupled to a light emitting device;
a gate of the second reset transistor is coupled with the reset line, a first electrode of the second reset transistor is coupled with the second electrode of the second light emission controlling transistor, and a second electrode of the second reset transistor is coupled with the second electrode of the first reset transistor.

20. The pixel circuit according to claim 19, wherein the first electrode of the first light emission controlling transistor and the active layer of the first reset transistor are located in a same layer, the first power line is coupled to the first electrode of the first light emission controlling transistor through an eighth via hole, and the eighth via hole penetrates through the first gate insulating layer, the second gate insulating layer, and the interlayer dielectric layer.

21. The pixel circuit according to claim 19, further comprising: a third bridge located in the same layer as the first power line and coupled with the second electrode of the second light emission controlling transistor via a ninth via hole penetrating through the first gate insulating layer, the second gate insulating layer and the interlayer dielectric layer,
the light emitting device is located on a side, away from the substrate, of a layer where the data line is located, a planarization layer is arranged between the layer where the data line is located and the light emitting device, and the light emitting device is coupled with the third bridge through a tenth through hole penetrating through the planarization layer.

22. The pixel circuit according to claim 10, wherein the reset line and the light emission control line both extend in the first direction and are located in the same layer as the gate line, and the orthogonal projection of the driving transistor on the substrate is located between an orthogonal projection of the emission control line on the substrate and the orthogonal projection of the gate line on the substrate.

23. The pixel circuit according to claim 1, wherein there is a first distance between the first power line and the second overlapping area in the first direction, and there is a second distance between the data line to which the pixel circuit is coupled and the second overlapping area in the first direction, and wherein the first distance is greater than or equal to the second distance.

24. The pixel circuit according to claim 1, wherein the first overlapping area has a first boundary proximal to the data line, the second overlapping area has a second boundary proximal to the data line, and the first boundary and the second boundary are located on a same straight line extending in the second direction.

25. A display substrate, comprising a plurality of pixels, each pixel having the pixel circuit claim 1 disposed therein.

26. A display device, comprising the display substrate of claim 25.

* * * * *